United States Patent [19]
Hajime et al.

[11] Patent Number: 5,821,166
[45] Date of Patent: Oct. 13, 1998

[54] METHOD OF MANUFACTURING SEMICONDUCTOR WAFERS

[75] Inventors: Hirofumi Hajime, Miyazaki; Toshiharu Yubitani, Miyazaki-gun, both of Japan

[73] Assignee: Komatsu Electronic Metals Co., Ltd., Hiratsuka, Japan

[21] Appl. No.: 767,031

[22] Filed: Dec. 12, 1996

[51] Int. Cl.⁶ .................................................. H01L 21/302
[52] U.S. Cl. ............................................. 438/691; 438/692
[58] Field of Search ...................................... 438/690–694

[56] References Cited

U.S. PATENT DOCUMENTS

| | | | |
|---|---|---|---|
| 3,951,728 | 4/1976 | Eagshgira et al. | 156/600 |
| 4,276,114 | 6/1981 | Takano et al. | 156/645 |
| 5,043,044 | 8/1991 | Hattori et al. | 156/645 |
| 5,400,548 | 3/1995 | Huber et al. | 451/41 |
| 5,429,711 | 7/1995 | Watanabe et al. | 216/52 |
| 5,447,890 | 9/1995 | Kato et al. | 438/691 |
| 5,516,706 | 5/1996 | Kusakabe | 438/691 |
| 5,679,212 | 10/1997 | Kato et al. | 438/691 |

FOREIGN PATENT DOCUMENTS 628992  12/1994  European Pat. Off. .

*Primary Examiner*—John Niebling
*Assistant Examiner*—Michael S. Lebentritt
*Attorney, Agent, or Firm*—Varndell Legal Group

[57] ABSTRACT method of manufacturing semiconductor wafers, which can prevent the pendent surface phenomenon during the mirror polishing of the wafers and can enhance the flatness of the mirror polished surfaces. The method of manufacturing semiconductor wafers according to this invention includes slicing ingots into wafers, chamfering the peripheral edge portions of the wafers, lapping the sliced surfaces of the wafers, grinding the lapped surfaces of the wafers to form a gradual concave shape, mirror polishing the ground surfaces of the wafers, and finally cleaning the mirror polished wafers.

4 Claims, 2 Drawing Sheets

ND OF THE INVENTION

1. Field of the Invention

This invention relates to a method of manufacturing semiconductor wafers by polishing a single-sided surface or both-sided surfaces of each wafer, in particular to a method with characteristics that the surfaces of the wafers are processed to form a gradual concave shape before mirror polishing.

2. Description of Related Art

Recently, in line with the development of IC manufacturing technology, the semiconductor wafers used in device engineering require quality enhancement. In particular, the flatness of the wafers may affect the manufacturing yield of a semiconductor device manufactured by using the wafers and thus manufacturing semiconductor wafers with high flatness becomes an important task to manufacturers.

An example concerning flattening semiconductor wafers is a Japanese Patent Publication Laid-Open No. 8-236489 entitled "A method for manufacturing semiconductor wafers" filed by the same applicant of this invention applied on Feb. 28, 1995. The above method enhanced the flatness of a lapped wafer 11 [see FIG. 2a] by grinding, instead of etching used before, both sides of it [see FIG. 2b] simultaneously, to remove working strain 11a on the surfaces. After that, mirror polishing is conducted in order to get high quality semiconductor wafers with better flatness of the single-sided surface or both-sided surfaces.

Yet, when each surface of wafer is mirror polished, the peripheral edges of the wafers will become thinner than the center portions, resulting in the so-called pendent surface phenomenon shown in FIG. 2c, which is caused by a higher polishing rate on the peripheral edges than on the center portions. The thickness difference "t1" of the pendent surface is 0.2–0.5 μm when the thickness reduced during mirror polishing is less than 1.0 μm, and its effect on the device engineering need not to be taken into account. However, if the wafer in the pendent condition is unacceptable, even this small thickness difference will lead to problems in following steps of manufacturing processes.

SUMMARY OF THE INVENTION

The purpose of this invention, based on the above-mentioned problem, is to provide a method of manufacturing semiconductor wafers to prevent pendent surfaces induced by mirror polishing and to enhance the flatness of wafer surfaces.

According to the method of this invention, the surfaces of the wafers are processed to form a gradual concave shape before mirror polishing. The method of manufacturing semiconductor wafers according to this invention comprises the steps of slicing ingots into wafers, chamfering the peripheral edges of wafers, conducting lapping on the sliced surfaces of wafers, conducting grinding on the lapped surfaces of wafers to form a gradual concave shape on each surface and then mirror polishing the surfaces. Finally, wafers are cleaned after mirror polishing.

Alternately, the method of manufacturing the semiconductor wafers according to the invention may comprise slicing ingots into wafers, chamfering the peripheral edges of the wafers, lapping the sliced surfaces of wafers, etching the surfaces of the wafers to form a gradual concave shape on each surface, and then conducting mirror polishing on the surfaces of wafers. Finally, the wafers are cleaned after mirror polishing.

The method of manufacturing semiconductor wafers according to this invention may comprise slicing ingots into wafers, chamfering the peripheral edges of the wafers, lapping the sliced surfaces of the wafers, etching the lapped surfaces of the wafers, and grinding the surfaces of wafers to form a gradual concave shape on each surface, and then mirror polishing the surfaces. Finally, the wafer are cleaned after mirror polishing.

Surface forming conducted before the mirror polishing to form concave shapes on surfaces with the peripheral edge portions thicker than the center portions prevents the pendent surface effect, and can enhance the flatness of the surfaces extremely by offsetting the concave shape effect and pendent effect.

DETAILED DESCRIPTION OF THE INVENTION

Next, in the light of pertinent drawings, the embodiment of the present invention is explained. FIG. 1a through FIG. 1d are cross-sectional views of a wafer being subjected to the relevant processes according to the method of manufacturing the semiconductor wafers.

The processes before the both-sided surface polishing procedure in the embodiment is the same as that in the prior art, including slicing the ingot into the wafers, chamfering the peripheral edge portions of the wafers, and then lapping the chamfered wafers to make the thickness of the wafers uniform.

Figure 1A:
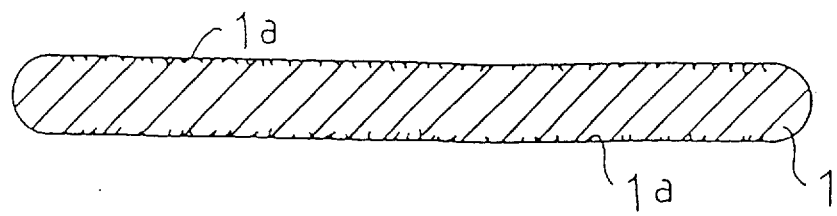
FIG. 1a through FIG. 1d are cross-sectional views of the wafer in different steps of manufacturing semiconductor wafers according to this invention.

As shown in FIG. 1a, working strains are incurred in the surfaces of the wafer after lapping. To remove such strains, both-sided surface polishing must be conducted. After that, two concave surfaces are formed on both sides of the wafer, and the peripheral edge portion is thicker than the center portion.

Here, the method of using both-sided polishing to form the concave shape on the wafer will be explained. When polishing the wafer, the polishing rate will be changed according to such factors as temperature differences of the polishing surfaces, the material of the friction faces of the grinder, pressure exerted on working surface, etc. Among the conditions mentioned above, the temperature of the polishing surfaces can be controlled within some predetermined ranges while other conditions are set to be constant.

Furthermore, comparing the flow rates of abrasive particles and cooling water between the peripheral edge and center portions of each wafer, it is found that the flow rates of abrasive particles and cooling water at the peripheral edge portion is faster than that at the center portion. This will cause poor heat dispersion at the center portion and result in gradually rising temperature toward the center portion. Therefore, the center portion with higher temperature compared to that of the peripheral edge portion will be ground faster under the condition mentioned above.

However, the change of the polishing rate based on the temperature difference occurs, only if the temperature difference is greater than certain specific value. And, the wafer pendent effect will occur when the temperature difference is less than the specific temperature. Thickness of the wafers removable only by mirror polishing is a little and the temperature is quite difficult to control, and there is really no way to prevent the pendent effect.

Accordingly, the wafers can be ground into concave shape by controlling the temperature difference, i.e., there exists a threshold rotation speed (a fixed value) for the grinder. At the threshold rotation speed, the surfaces of the wafers will be ground to a flat shape. If the number of rotations for both upper and lower fixed plates of the polishing machine is adjusted to a value higher than the fixed value, the temperature of the polishing surfaces will raise and thereby the surfaces of the wafers will be ground to a concave shape.

For instance, when grinding 8-inch diameter wafers, the rotation speed is set to be 40 r.p.m., at which the surfaces of the wafers can be ground into a flat shape. Increasing the rotation speed by 5 r.p.m., the thickness difference "t" between the center portions and peripheral edge portions will reach a value of 0.25~0.3 µm. Therefore, if the pendent surface thickness difference "t1" is expected to be 0.5 µm, the rotation speed should be raised by a value of 10 r.p.m. more than the set value.

Figure 1B:
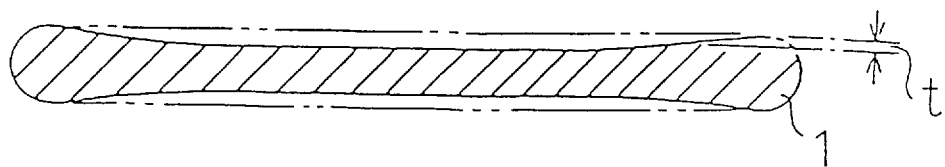
Figure 1C:
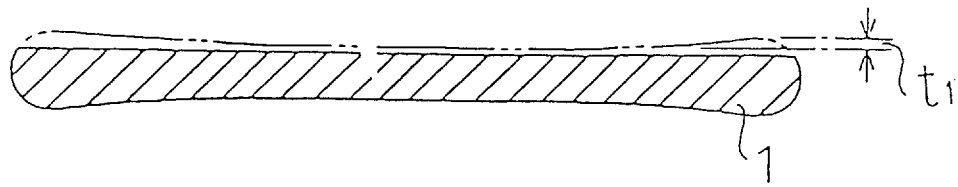
Figure 1D:
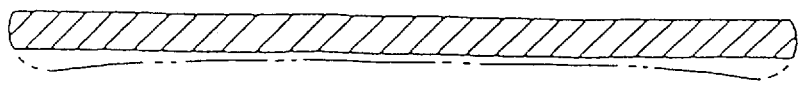
Figure 2A:
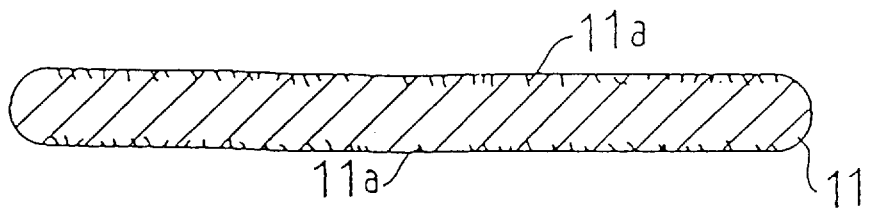
FIG. 2a through FIG. 2c are cross-sectional views of the wafer in different steps of manufacturing semiconductor wafers used in the prior art.
Figure 2B:
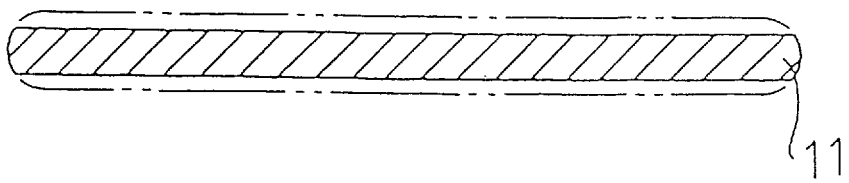
Figure 2C:
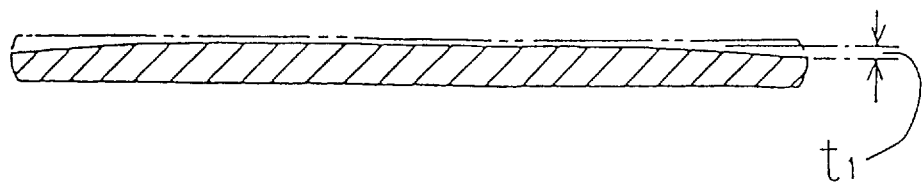

As shown in FIG. 1b, two concave surfaces with thickness difference "t" may be formed after polishing the surfaces of the wafer 1. And as shown in FIG. 1c, the pendent surface thickness difference "t1" formed after conducting the polishing to the wafer 1 can be offset by the thickness difference "t" mentioned above, so that the flat shape wafer can be obtained.

In this embodiment, both surfaces of the wafer are first formed into concave shape, and one surface (back side) remains concave shape. It is also possible to polish the back side surface of the wafer into a flat shape, if it is required by the following device engineering.

Moreover, in this embodiment, both of the rotation speeds relative to grinders are altered by the same value. However, it is also possible to raise only one rotation speed so as to give just one side of the wafer a concave shape.

Furthermore, in this embodiment, semiconductor wafers are ground on both sides to form concave shapes thereon. However, it is not intended to limit this invention by the disclosure of this embodiment. In the manufacturing method of removing the working strains by etching, the same procedure can also be used to enhance the flatness of the semiconductor surfaces. The method according to this invention can be combined the following two procedures, one is forming concave shape on surfaces of lapped wafers by etching, the other one is forming concave shape on surfaces of lapped wafers by grinding after conventional etching processes.

First, the procedure of forming concave shape on surfaces of lapped wafers by etching is explained hereinafter. In this procedure, etching liquid is prepared by mixing several chemicals and their concentration ratio and dilution degree are adjusted to a certain range in which self-catalyzed reaction will occur. This self-catalyzed reaction will speed up silicon resolution by the utilization of catalytic chain reaction. In other words, When wafers are rotated in the adjusted etching liquid to conduct an etching operation, a self-catalyzed reaction is sprightly at their center portions due to a little quantity of etching liquid resided thereon, and self-catalyzed reaction is difficult to occur on the peripheral edge portions of the wafers, i.e., the etching rate at the center portion is faster than that of the peripheral edge portions of the wafers, resulting in a thicker peripheral edge portion for each etched wafer.

Next, the procedure of forming concave shape on surfaces of wafers by grinding is explained. First, working strains on the surfaces caused by lapping operation are removed by etching, then the same as the above embodiment, grinding is applied on one surface (front surface) to form a concave shape, and subsequently mirror polishing is conducted. Since the thickness decreased in mirror polishing is larger than that decreased in a final polishing, the thickness difference caused by mirror polishing is at a larger value of 0.5∫5.0 µm. A concave shape having the same thickness difference is thus required.

The concave shape is easily to be formed by inclining the axis of the grinder toward the centers of the wafers during grinding.

Finally, use in combination with the above two procedures is explained hereinafter. After etching the lapped wafers to form concave shapes on their surfaces, the wafers with concave shapes are further treated by grinding. In this way, the surfaces of the wafers are flatter than when just using the etching, and the time required for grinding process is accordingly shortened.

With the configuration of this invention been described above, the mirror polishing according to this invention is able to prevent the pendent phenomenon occurred on the surfaces of the wafers and to raise the manufacturing yield of wafers with high flatness.

What is claimed is:

1. A method of manufacturing semiconductor wafers, comprising a step of mirror-polishing a single-side surface or both-side surfaces of each wafer, wherein the method further comprises a step of processing each surface of the wafers to be mirror-polished so as to form a concave shape with a thickness of a peripheral edge portion of the wafers greater than a thickness of a center portion of the wafers before the step of the mirror polishing.

2. A method of manufacturing semiconductor wafers comprising the steps of:

slicing an ingot into a plurality of wafers;

chamfering the peripheral edges of the wafer;

lapping at least one-side surface of each sliced wafer;

grinding the lapped surface of the wafer so as to form a concave shape with a thickness of a peripheral edge portion of the wafer greater than a thickness of a center portion of the wafer;

mirror polishing the ground surface of the wafer; and cleaning of the mirror polished surface of the wafer.

3. A method of manufacturing semiconductor wafers comprising the steps of:

slicing an ingot into a plurality of wafers;

chamfering the peripheral edges of the wafer;

lapping the sliced surface of the wafer;

etching the lapped surface of the wafer so as to form a concave shape with a thickness of a peripheral edge portion of the wafer greater than a thickness of a center portion of the wafer;

mirror polishing the etched surface of the wafer; and cleaning of the mirror polished surface of the wafer.

4. A method of manufacturing semiconductor wafers comprising the steps of:

slicing an ingot into a plurality of wafers;

chamfering the peripheral edges of the wafer;

lapping at least one-side surface of each sliced wafer;

etching the lapped surface of the wafer;

grinding the etched surface of the wafer so as to form a concave shape with a thickness of a peripheral edge portion of the wafer greater than a thickness of a center portion of the wafer;

mirror polishing the ground surface of the wafer; and cleaning of the mirror polished surface of the wafer.

* * * * *